(12) United States Patent
Laitinen et al.

(10) Patent No.: US 7,968,914 B2
(45) Date of Patent: Jun. 28, 2011

(54) MULTI-COMPONENT ELECTRICAL MODULE (75) Inventors: Matti Laitinen, Kirkkonummi (FI); Markku Talja, Jarvenpaa (FI); Jukka Sikanen, Sulkava (FI); Christoph Haederli, Zurich (CH)

(73) Assignee: ABB Oy, Helsinki (FI)

( * ) Notice: Subject to any disclaimer, the term of this patent is extended or adjusted under 35 U.S.C. 154(b) by 186 days.

(21) Appl. No.: 12/366,182

(22) Filed: Feb. 5, 2009

(65) Prior Publication Data
US 2009/0201659 A1    Aug. 13, 2009

(30) Foreign Application Priority Data
Feb. 7, 2008   (EP) ..................... 08151151

(51) Int. Cl.
*H01L 29/66* (2006.01)
*H01L 21/337* (2006.01)
*H05K 7/02* (2006.01)
*H05K 13/04* (2006.01)

(52) U.S. Cl. . 257/197; 257/273; 257/526; 257/E23.027; 257/E29.197; 361/807; 438/189; 29/729

(58) Field of Classification Search ........................ None
See application file for complete search history.

(56) References Cited

U.S. PATENT DOCUMENTS

| 5,926,372 | A | 7/1999 | Rinehart |
| 2003/0001258 | A1 | 1/2003 | Kodama |

FOREIGN PATENT DOCUMENTS

| EP | 0637080 | 2/1995 |
| EP | 0962973 | 12/1999 |

OTHER PUBLICATIONS

Priority Search Report dated Jul. 9, 2008, in priority application.

*Primary Examiner* — Alonzo Chambliss
(74) *Attorney, Agent, or Firm* — Young & Thompson (57) ABSTRACT A mechanical construction of an electrical module includes two or more electrical components (102-105). Each of the electrical components has a contact surface (106-109) that is capable of forming a galvanic contact with an external electrical conductor. The electrical module includes a holder element (101) that includes flexible material arranged to flexibly support the electrical components with respect to each other in such a way that the contact surfaces of the electrical components are capable of aligning with external surfaces independently of each other.

14 Claims, 8 Drawing Sheets

MULTI-COMPONENT ELECTRICAL MODULE

FIELD OF THE INVENTION

The invention relates to a mechanical construction of an electrical module that comprises two or more electrical components. Furthermore, the invention relates to an electrical converter device comprising one or more electrical modules and to a method for assembling an electrical converter device.

BACKGROUND

An assembly process of an electrical converter device, e.g. a frequency converter, can be made simpler, faster, and more cost effective by using electrical modules that contain two or more electrical components such as, for example, diodes and/or insulated gate bipolar transistors (IGBT). In an assembly process of an electrical converter device it is significantly faster, simpler, and more cost effective to install a single electrical module than to install a corresponding amount of separate electrical components such as e.g. diodes and IGBTs.

Certain electrical components, especially high power electrical components, are installed in such a way that an electrical component is pressed against a surface of an electrical conductor element that forms a galvanic contact with a contact surface of the electrical component. The said contact surface represents an electrical terminal of the electrical component, e.g. a cathode or an anode of a diode, an emitter or a collector of a bipolar transistor, or a drain or a source of a field effect transistor. As the output power and thus the current rating of an electrical converter device increases, parallel connection of the electrical components becomes usually inevitable. In the situation in which there are parallel connected electrical components, it is important that all the electrical components are pressed against an electrical conductor element in a sufficiently uniform manner with regard to pressing forces and mutual alignments between contact surfaces of the electrical components and the surface of the electrical conductor element. The above-mentioned facts are important from the viewpoint of balance of electrical current division between the parallel connected electrical components and from the view-point of thermal conductivity between the electrical components and the electrical conductor element. The requirements related to pressing forces and to mutual alignments between contact surfaces of electrical components and a surface of an electrical conductor element complicate the applicability of multi-component electrical modules and limit the amount of electrical components that can be integrated into a single electrical module. When using a multi-component electrical module it is more challenging to guarantee that all electrical components of the multi-component electrical module are pressed against an electrical conductor element in a sufficiently uniform manner than when using separate electrical components.

SUMMARY

In accordance with a first aspect of the invention, there is provided a new electrical module. The electrical module comprises:
two or more electrical components, each of the electrical components having a first contact surface capable of forming a galvanic contact with an external electrical conductor and a second contact surface on an opposite side of that electrical component with respect to the first contact surface of that electrical component, the second contact surface being capable of forming a galvanic contact with another external electrical conductor, and
a holder element including flexible material arranged to support the electrical components with respect to each other in such a way that the first contact surfaces of the electrical components are capable of aligning with external surfaces independently of each other.

Each electrical component of the electrical module is able to align with e.g. a surface of an electrical conductor element independently of other electrical components. Therefore, it is easier to guarantee that all the electrical components of the electrical module are pressed against e.g. the surface of the electrical conductor element in a sufficiently uniform manner and, as a consequence, a need for de-rating the electrical components of the electrical module with respect to rating of corresponding separate electrical components is usually mitigated.

In accordance with a second aspect of the invention, there is provided a new electrical converter device. The electrical converter device comprises at least one an electrical module according to the invention. The electrical converter device can be, e.g. an inverter, a rectifier, and/or a frequency converter.

In accordance with a third aspect of the invention, there is provided a new method for assembling an electrical converter device. The method comprises installing, as an element of the electrical converter device, at least one electrical module that comprises:
two or more electrical components, each of the electrical components having a first contact surface capable of forming a galvanic contact with an external electrical conductor and a second contact surface on an opposite side of that electrical component with respect to the first contact surface of that electrical component, the second contact surface being capable of forming a galvanic contact with another external electrical conductor, and
a holder element,
wherein the holder element includes material that is, at least during the installation of the electrical module, flexible and arranged to support the electrical components of the electrical module with respect to each other in such a way that the first contact surfaces of the electrical components are capable of aligning with external surfaces independently of each other.

A number of exemplifying embodiments of the invention are described in accompanied dependent claims.

Various embodiments of the invention both as to constructions and to methods of operation, together with additional objects and advantages thereof, will be best understood from the following description of specific exemplifying embodiments when read in connection with the accompanying drawings.

The exemplifying embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which.

DESCRIPTION OF THE EMBODIMENTS

Figure 1A:
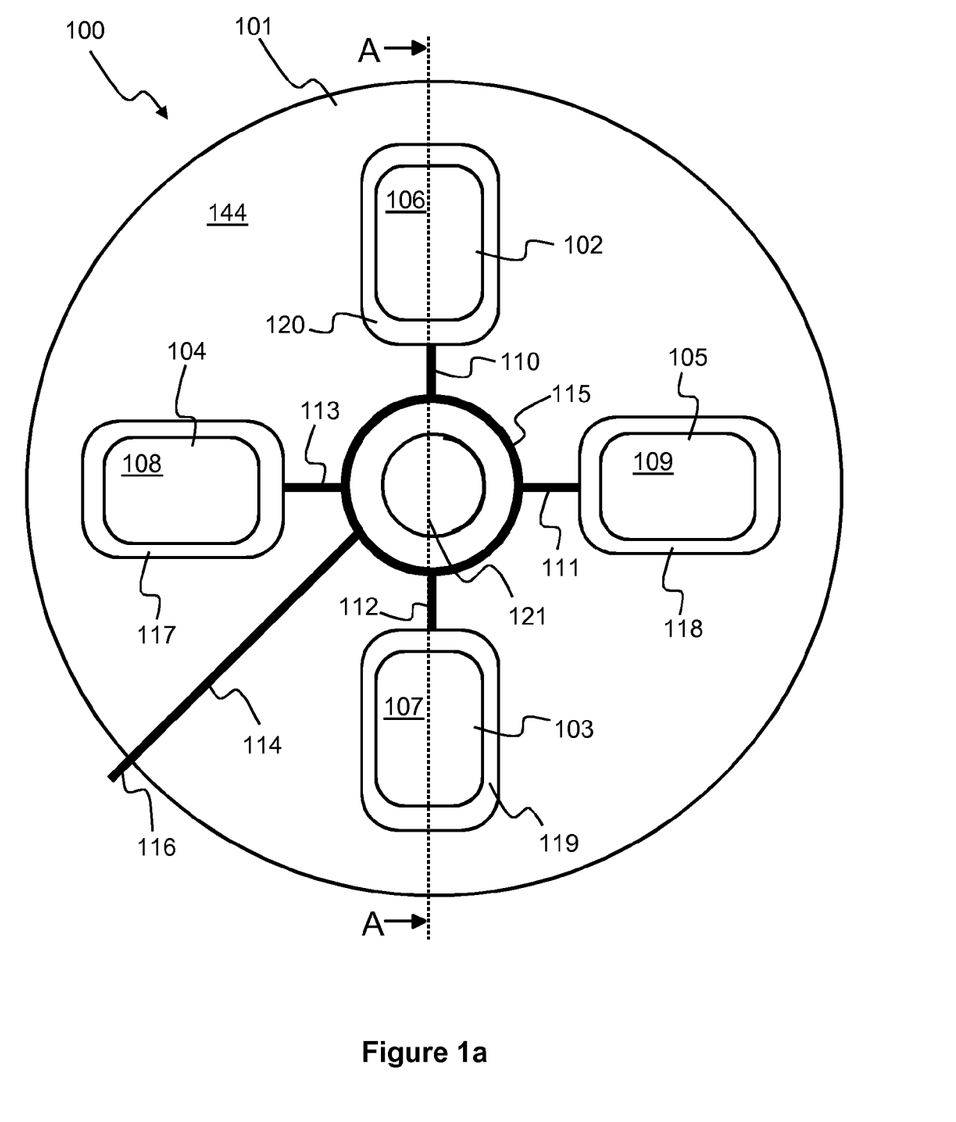
FIGS. 1a, 1b, 1c, 1d, and 1e show an electrical module according to an embodiment of the invention, a section view of the electrical module in an exemplifying operating environment, a circuit diagram that corresponds to FIG. 1b, and an illustration of installing the electrical module.
Figure 1B:
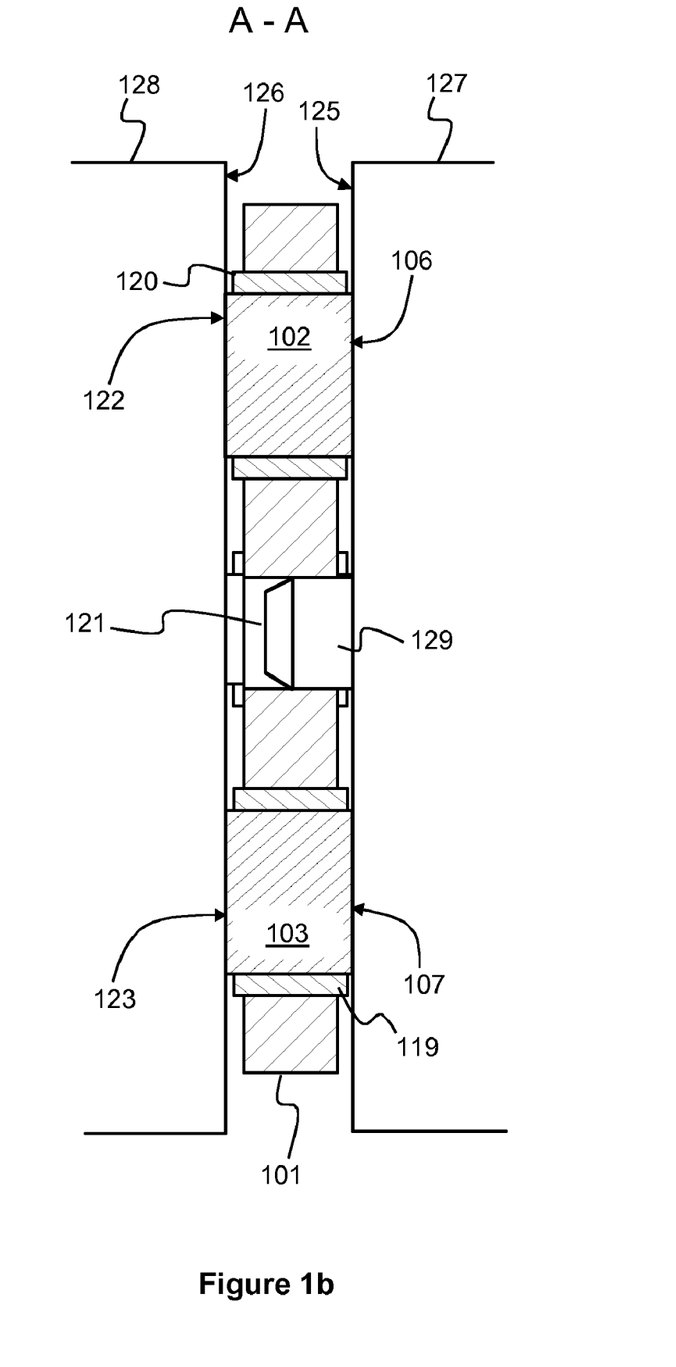

FIG. 1a shows an electrical module 100 according to an embodiment of the invention. FIG. 1b shows a section view A-A of the electrical module in an exemplifying situation in which the electrical module is between electrical conductor elements 127 and 128. The electrical conductor elements 127 and 128 are arranged to press the electrical module in a direction perpendicular to surfaces 125 and 126 of the electrical conductor elements. The electrical module comprises electrical components 102-105. Each of the electrical components has a first contact surface 106-109 that is capable of forming a galvanic contact with the electrical conductor element 127. The electrical module comprises a holder element 101 including flexible material that is arranged to support the electrical components with respect to each other in such a way that the first contact surfaces of the electrical components are capable of aligning with the surface 125 independently of each other. The fact that the electrical components 102-105 are supported in a flexible manner with respect to each other allows a greater tolerance between the shape of the surface 125 and an ideal plane. The electrical components have second contact surfaces, e.g. 122 and 123 in FIG. 1b, on opposite sides of the electrical components with respect to the first contact surfaces. The second contact surfaces are capable of forming galvanic contacts with the electrical conductor element 128. The electrical module 100 contains four electrical components 102-105. It should be noted that in a general case, the number of electrical components of an electrical module according to this embodiment of the invention can be any number greater than one.

An electrical component 102, 103, 104, and/or 105 of the electrical module can be, for example, a diode, a thyristor, a gate turn-off thyristor (GTO), a field effect transistor (FET), a bipolar transistor, or an insulated gate bipolar transistor (IGBT). The electrical components of the electrical module can be mutually similar or some electrical components can be different from some other electrical components.

An electrical component 102, 103, 104, and/or 105 of the electrical module can be as well a combination of two or more different sub-components. For example, an electrical component of the electrical module can be an antiparallel pair of a diode and a thyristor, an antiparallel pair of a diode and a gate turn-off thyristor (GTO), an antiparallel pair of a diode and a field effect transistor (FET), an antiparallel pair of a diode and a bipolar transistor, or an antiparallel pair of a diode and an insulated gate bipolar transistor (IGBT). An electrical component 102, 103, 104, and/or 105 of the electrical module can be as well a monolithic component that is arranged to realize functionality of two or more different electrical components, e.g. functionalities of a diode and an IGBT.

Figure 1C:
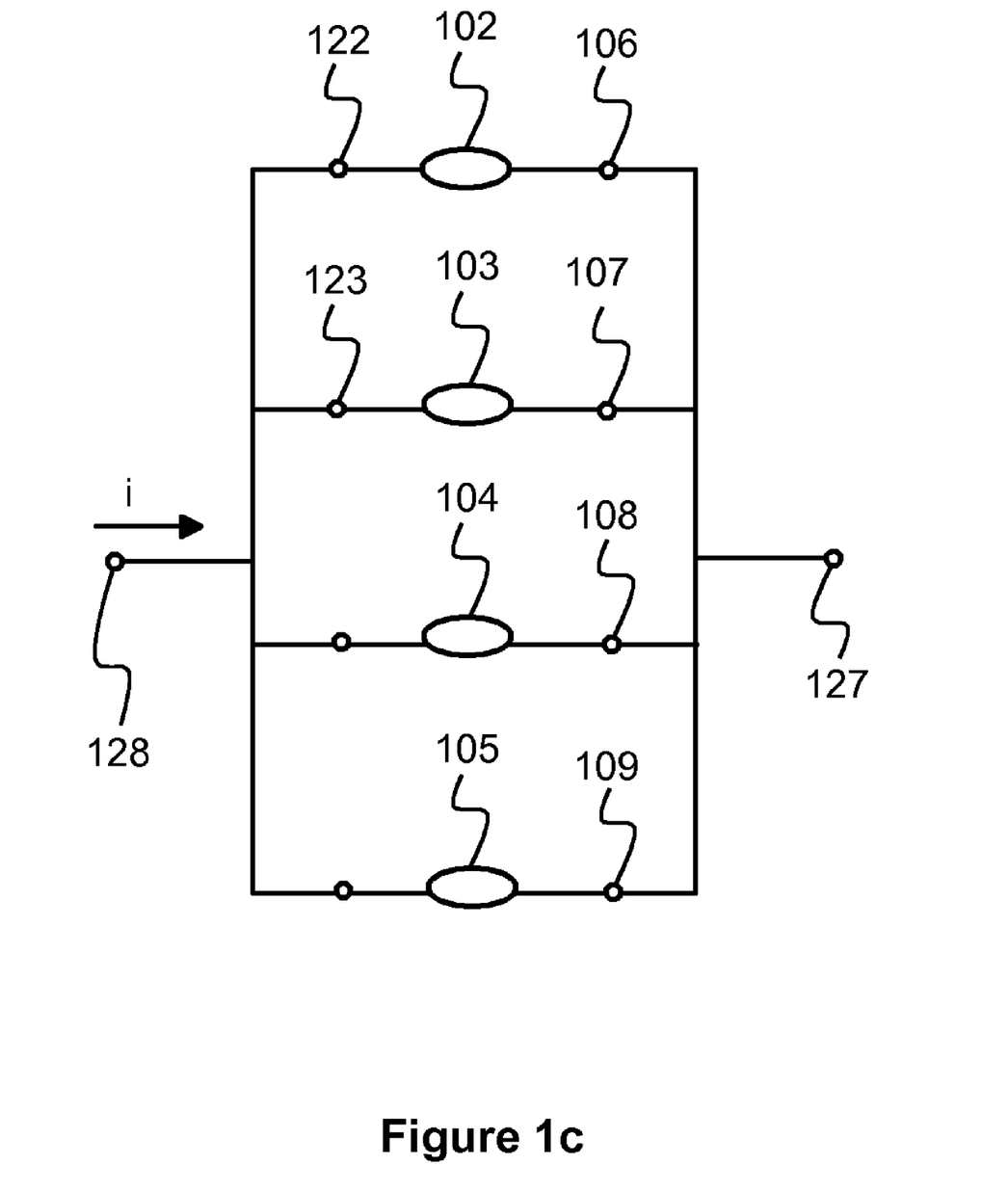

FIG. 1c shows a circuit diagram that corresponds to FIG. 1b. The electrical components 102-105 are depicted with ovals in FIG. 1c. The reference numbers in FIG. 1c correspond to same entities as in FIGS. 1a and 1b. The circuit diagram illustrates how the electrical components 102-105 are parallel connected between the electrical conductor elements 127 and 128. Due to the fact that the holder element 101 is capable of supporting the electrical components 102-105 in a flexible manner, the electrical components 102-105 are pressed against the surfaces 127 and 128 in a sufficiently uniform manner. This fact is important from the viewpoint of balanced division of electrical current i between the electrical components 102-105 and from the viewpoint of thermal conductivity between the electrical components and the electrical conductor elements 127 and 128.

In an electrical module according to an embodiment of the invention, the holder element 101 is made of flexible material. The holder element can be made of, for example, silicone, epoxy, plastic or a suitable composition of two or more of the said materials. Some examples of suitable silicone materials are SE2003, QSil573 and AS1420 by ACC Silicones, and SOLARITE SI221FR and SOLARITE SI222HTC by Solar compounds. Examples of suitable epoxy materials are 20-3006 and 20-3001 by Epoxies etc, Circalok 6031 A/B by Lord, and Scotchcast 280 by 3M. The holder element can also be made of suitable hot melt adhesive. The holder element should maintain its flexibility at least till the time the electrical module has been installed into a product, e.g. into a frequency converter. The material of the holder element 101 is preferably able to withstand temperatures up to about 175° C.

Figure 1D:
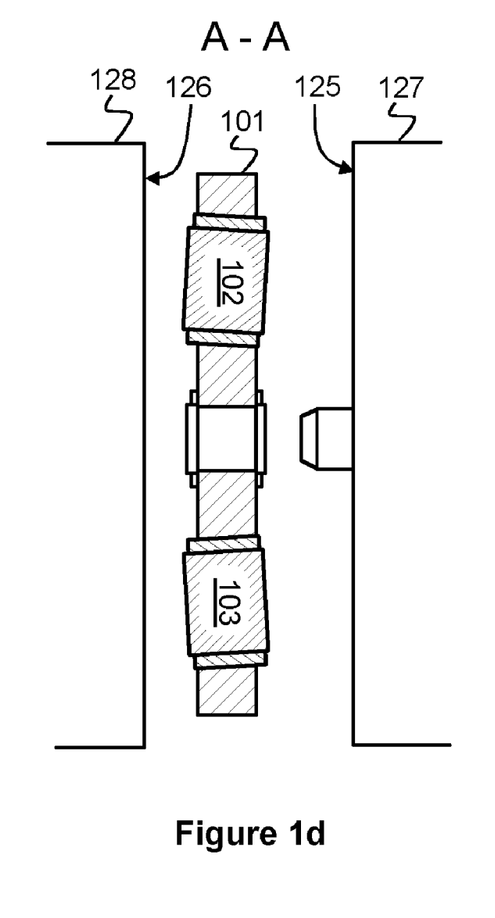
Figure 1E:
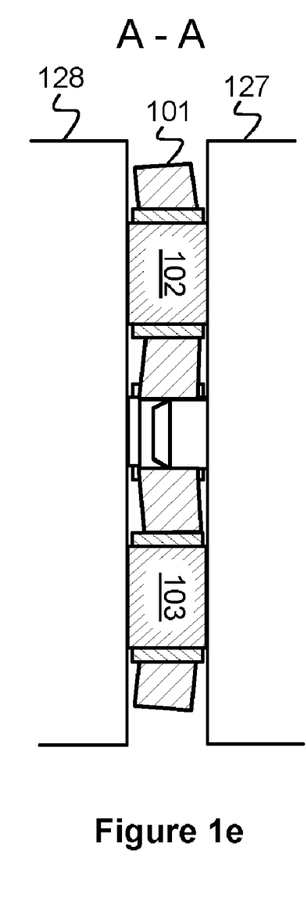

FIGS. 1d and 1e show an illustration of installing an electrical module whose holder element 101 is made of flexible material. FIG. 1d shows an exemplifying situation in which the contact surfaces of the electrical components 102 and 103 are not aligned according to a same plane. The misalignment of the electrical components may be e.g. a consequence of limited manufacturing accuracy. FIG. 1e shows a situation that takes place after the electrical module is pressed between the surfaces 125 and 126 of the electrical conductor elements 127 and 128. The flexible material of the holder element 101 is elastic in such a way that each electrical component is able to align with the surfaces 125 and 126 independently of the other electrical components of the electrical module. In FIG. 1d the misalignment of the electrical components is exaggerated for illustrative purposes.

In an electrical module according to an embodiment of the invention, the holder element comprises both rigid material and flexible material. The flexible material is located between the electrical components 102-105 and a part of the holder element that is made of the rigid material. The flexible material provides the flexible support for the electrical components. The flexible material can be e.g. silicone, epoxy, plastic, or a suitable composition of two or more of the said materials. The flexible material can also contain e.g. suitable hot melt adhesive. The flexible material should maintain its flexibility at least till the time the electrical module has been installed into a product, e.g. into a frequency converter. The flexible material is preferably able to withstand temperatures up to about 175° C.

In an electrical module according to an embodiment of the invention, the holder element 101 is made of electrically insulating material. In this case it can be allowed that the holder element is in touch with the first and/or second contact surfaces of the electrical components 102-105.

In an electrical module according to an embodiment of the invention, the holder element 101 comprises electrically insulating material 117-120 between a body 144 of the holder element and the first and second contact surfaces of the electrical components 102-105. In this case it is not necessary that the body of the holder element is made of electrically insulating material. Furthermore, in the electrical module shown in FIGS. 1a and 1b, the body 144 of the holder element can be made of rigid material if the electrically insulating material 117-120 is sufficiently flexible material.

An electrical module according to an embodiment of the invention comprises a control terminal 116 that is common to the electrical components 102-105. Electrical conductors 110-115 from the control terminal to the electrical components can be, for example, inside the holder element or the electrical conductors can be on a surface of the holder element.

In an electrical module according to an embodiment of the invention, the holder element 101 comprises a hole 121. The hole can be utilized e.g. when installing the electrical module between the electrical conductor elements 127 and 128. For example, the electrical conductor element 127 comprises an overhang 129 that fits into the hole.

Figure 2A:
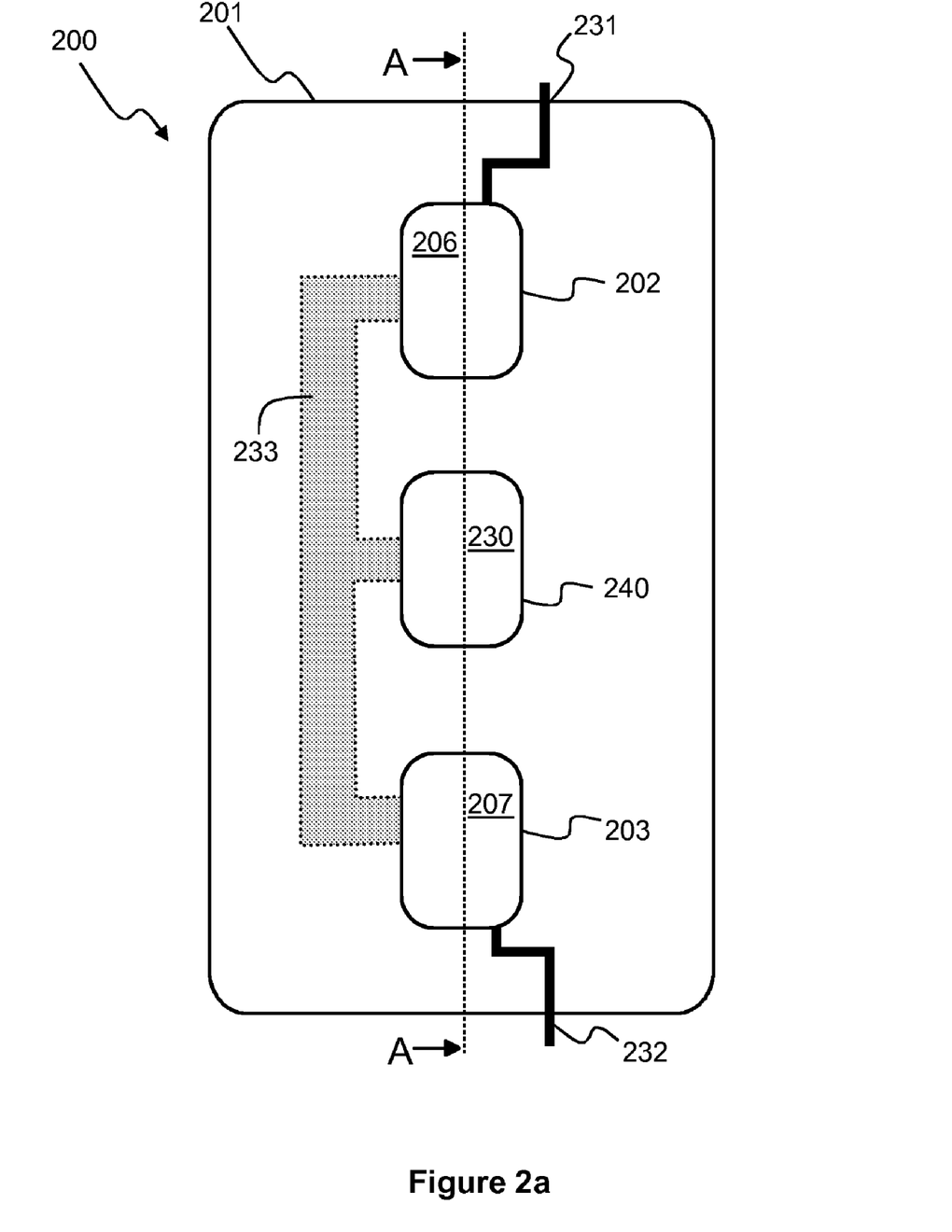
FIGS. 2a, 2b, and 2c show an electrical module according to an embodiment of the invention, a section view of the electrical module in an exemplifying operating environment, and an exemplifying circuit diagram that corresponds to FIG. 2b.
Figure 2B:
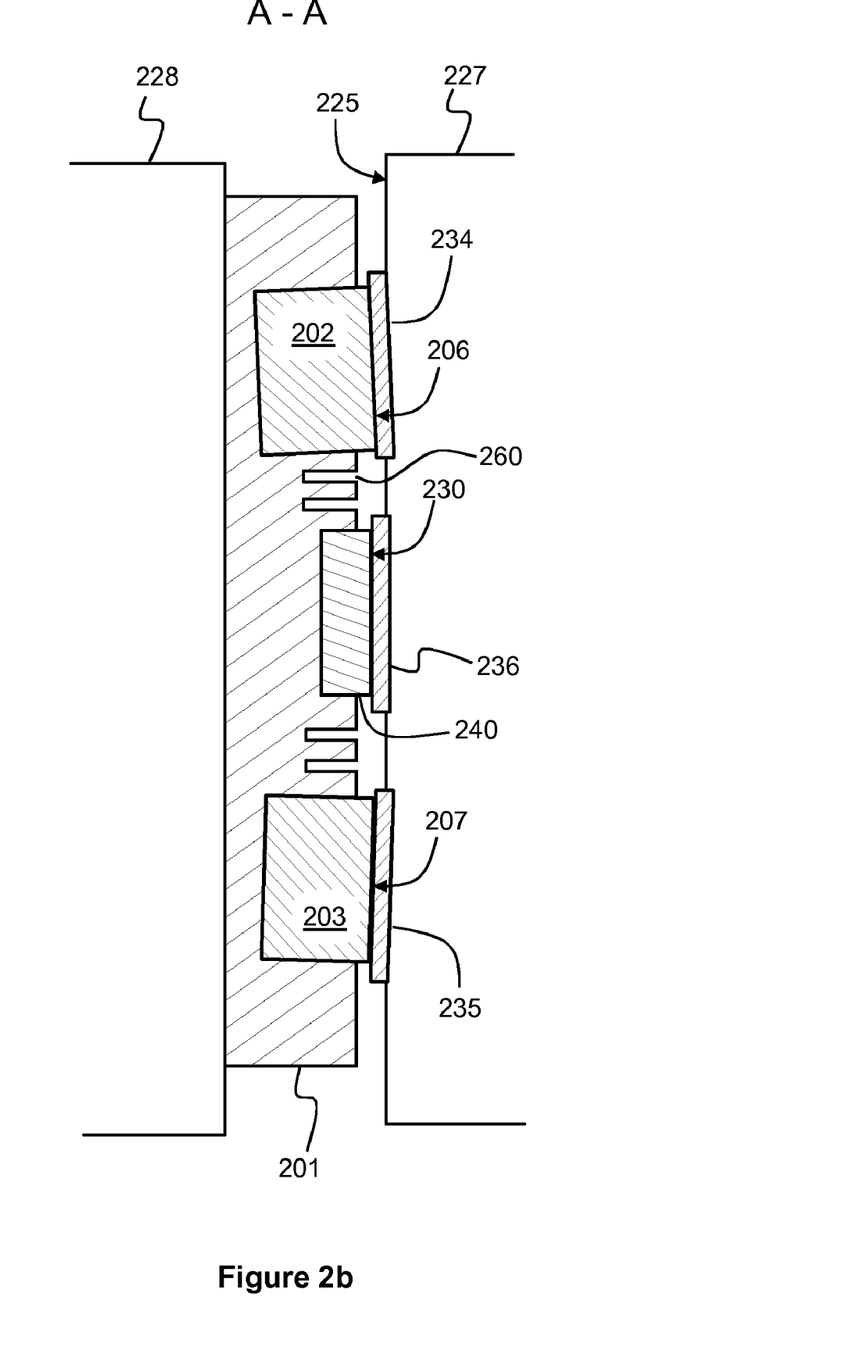
Figure 2C:
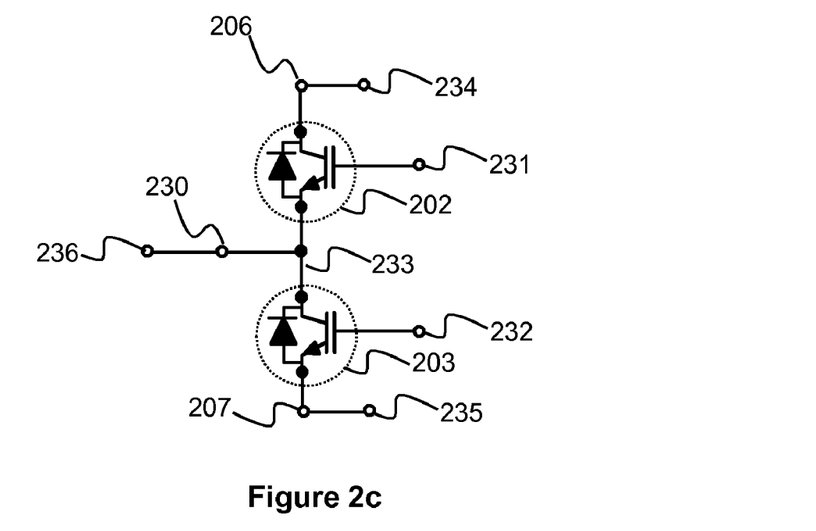

FIG. 2a shows an electrical module 200 according to an embodiment of the invention. FIG. 2b shows a section view A-A of the electrical module in an exemplifying situation in which the electrical module is between a support element 228 and a connection element 227 that comprises electrical conductor plates 234, 235, and 236. The support element 228 and the connection element 227 are arranged to press the electrical module in a direction perpendicular to a surface 225. The electrical module comprises electrical components 202 and 203. The electrical component 202 has a contact surface 206 that is capable of forming a galvanic contact with the electrical conductor plate 234. The electrical component 203 has a contact surface 207 that is capable of forming a galvanic contact with the electrical conductor plate 235. The electrical module comprises an electrical conductor plate 240 that has a contact surface 230 capable of forming a galvanic contact with the electrical conductor plate 236. The electrical module comprises an electrical conductor 233 that is arranged to connect one terminal of the electrical component 202 to the contact surface 230 and one terminal of the electrical component 203 to the contact surface 230. In this exemplifying embodiment of the invention the electrical components 202 and 203 are antiparallel pairs of a diode and an insulated gate bipolar transistor (IGBT). FIG. 2c shows a circuit diagram that corresponds to FIGS. 2a and 2b. The reference numbers in FIG. 2c correspond to same entities as in FIGS. 2a and 2b. The electrical module comprises control terminals 231 and 232 that are connected to the gates of the electrical components 202 and 203, respectively. The electrical module can constitute, for example, an output phase of an inverter bridge.

The electrical module 200 comprises a holder element 201 that includes flexible material arranged to flexibly support the electrical components 202 and 203 and the electrical conductor plate 240 with respect to each other in such a way that the contact surfaces 206 and 207 of the electrical components and the contact surface 230 of the electrical conductor plate 240 are capable of aligning with surfaces of the electrical conductor plates 234, 235, 236 independently of each others. FIG. 2b illustrates a situation in which the surfaces of the electrical conductor plates 234, 235, 236 are not in a same plane and, as a consequence, the electrical components 202 and 203 and the electrical conductor plate 240 are individually aligned with the surfaces of the electrical conductor plates 234, 235, 236. In FIG. 2b, the deviation of the surfaces of the electrical conductor plates 234, 235, 236 from the same plane is exaggerated for illustrative purposes.

In an electrical module according to an embodiment of the invention the holder element 201 is provided with grooves 260 or fins that are arranged to increase creeping distances between the electrical components 202 and 203 and/or between the electrical components and the electrical conductor plate 240. It is also possible that physical dimensions of the holder element 201 are selected in such a way that sufficient creeping distances are obtained.

Figure 3:
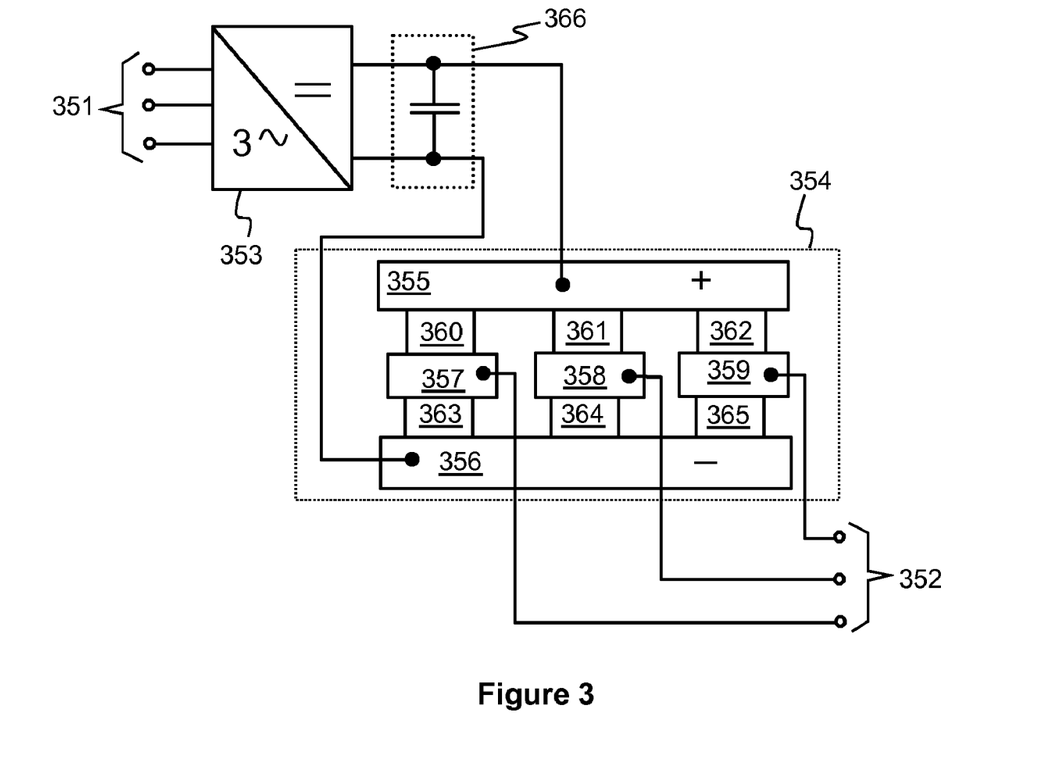
FIG. 3 shows an electrical converter device according to an embodiment of the invention.

An electrical converter device according to an embodiment of the invention comprises at least one an electrical module according to an embodiment of the invention. FIG. 3 shows an electrical converter device according to an embodiment of the invention. The electrical converter device comprises an electrical terminal 351 for connecting the electrical converter device to an alternating voltage network (not shown) and an electrical terminal 352 for connecting the electrical converter device to a load (not shown). The electrical converter device comprises a converter unit 353 that can be e.g. a rectifier that is arranged to transfer energy from an alternating voltage network to an intermediate circuit 366 of the electrical converter device. The converter unit 353 can be as well a device that is capable of transferring energy, not only from the alternating voltage network to the intermediate circuit 366, but also from the intermediate circuit back to the alternating voltage network.

The electrical converter device comprises an inverter bridge 354 that is able to transfer energy from the intermediate circuit 366 to the load and also to transfer energy from the load to the intermediate circuit. The main circuit of the inverter bridge comprises electrical conductor elements 355 and 356 that are connected to the intermediate circuit, and electrical conductor elements 357, 358, and 359 that are connected to different phases of the electrical terminal 352. The main circuit of the inverter bridge comprises electrical modules 360-365 that are located between the electrical conductor elements as shown in FIG. 10. Each of the electrical modules 360-365 comprises:

two or more electrical components, each of the electrical components having contact surfaces that are capable of forming galvanic contacts with electrical conductor elements between which the electrical module in question is located, and
  a holder element including flexible material arranged to support the electrical components with respect to each other in such a way that the electrical components are capable of aligning, independently of each other, with the electrical conductor elements between which the electrical module in question is located.

The electrical modules 360-365 can be, for example, according to what is described in FIGS. 1a and 1b and in the text passages related to FIGS. 1a and 1b. For example, the electrical module 360 may correspond to the electrical module depicted in FIGS. 1a and 1b, and the electrical conductor elements 355 and 357 may correspond to the electrical conductor elements 127 and 128 depicted in FIG. 1b.

The electrical converter device shown in FIG. 3 is a frequency converter. An electrical converter device according to an embodiment of the invention can be as well, for example, a mere inverter or a mere rectifier.

Figure 4:
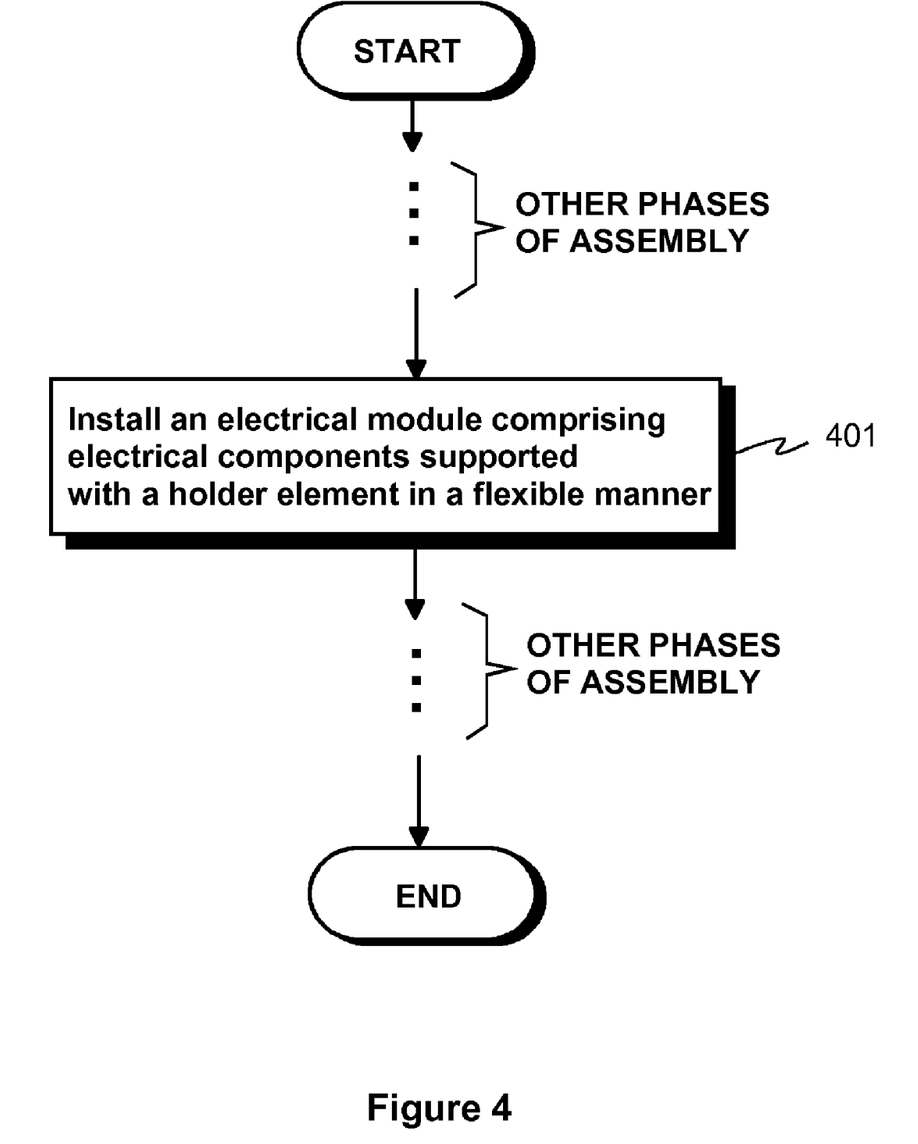
FIG. 4 is a flow chart of a method according to an embodiment of the invention for assembling an electrical converter device.

FIG. 4 is a flow chart of a method according to an embodiment of the invention for assembling an electrical converter device. One of the method phases for assembling the electrical converter device comprises installing 401, as an element of the electrical converter device, at least one electrical module (e.g. 100 in FIG. 1a) that comprises:

two or more electrical components (e.g. 102-105 in FIGS. 1a and 1b), each of the electrical components having a first contact surface (e.g. 106-109 in FIG. 1*a*) that is capable of forming a galvanic contact with an external electrical conductor (e.g. 127 in FIG. 1*b*), and a holder element (e.g. 101 in FIGS. 1*a* and 1*b*), wherein the holder element includes material that is, at least during the installation of the electrical module, flexible and arranged to support the electrical components of the electrical module with respect to each other in such a way that the first contact surfaces of the electrical components are capable of aligning with external surfaces independently of each other.

In a method according to an embodiment of the invention, each of the electrical components of the electrical module has a second contact surface (e.g. 122 and 123 in FIG. 1*a*) on an opposite side of that electrical component with respect to the first contact surface of that electrical component, the second contact surface being capable of forming a galvanic contact with another external electrical conductor.

In a method according to an embodiment of the invention, each of the electrical components of the electrical module is one of the following: a diode, a thyristor, a gate turn-off thyristor (GTO), a field effect transistor (FET), a bipolar transistor, and an insulated gate bipolar transistor (IGBT).

In a method according to an embodiment of the invention, each of the electrical components of the electrical module is one of the following: an antiparallel pair of a diode and a thyristor, an antiparallel pair of a diode and a gate turn-off thyristor (GTO), an antiparallel pair of a diode and a field effect transistor (FET), an anti-parallel pair of a diode and a bipolar transistor, and an antiparallel pair of a diode and an insulated gate bipolar transistor (IGBT).

In a method according to an embodiment of the invention, one of the following is used as the flexible material of the holder element: silicone, epoxy, and plastic.

In a method according to an embodiment of the invention, hot melt adhesive is used as the flexible material of the holder element.

In a method according to an embodiment of the invention, the holder element is made of electrically insulating material.

In a method according to an embodiment of the invention, the holder element comprises electrically insulating material (e.g. 117-120 in FIG. 1*a*) between a body (e.g. 144 in FIG. 1*a*) of the holder element and the first and second contact surfaces of the electrical components.

In a method according to an embodiment of the invention, the electrical module comprises a control terminal (e.g. 116 in FIG. 1*a*) that is common to the electrical components of the electrical module. Electrical conductors (e.g. 110-115 in FIG. 1*a*) from the control terminal to the electrical components can be, for example, inside or on a surface of the holder element.

In a method according to an embodiment of the invention the holder element comprises a hole (e.g. 121 in FIG. 1*a*) that makes the installation of the electrical module easier.

While there have been shown and described and pointed out fundamental novel features of the invention as applied to embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. The specific examples provided in the description given above should not be construed as limiting. Therefore, the invention is not limited merely to the embodiments described above, many variants being possible without departing from the scope of the inventive idea defined in the independent claims.

What is claimed is:

1. An electrical module, comprising:

two or more electrical components, each of the electrical components having a first contact surface capable of forming a galvanic contact with an electrical conductor that is external to the electrical module, and a holder element including flexible material with via holes arranged to support the electrical components with respect to each other in such a way that the first contact surfaces of the electrical components are capable of aligning with external surfaces independently of each other, wherein each of the electrical components has a second contact surface on an opposite side of that electrical component with respect to the first contact surface of that electrical component, the second contact surface being capable of forming a galvanic contact with another electrical conductor that is external to the electrical module.

2. An electrical module according to claim 1, wherein each of the electrical components is one of the following: a diode, a thyristor, a gate turn-off thyristor (GTO), a field effect transistor (FET), a bipolar transistor, and an insulated gate bipolar transistor (IGBT).

3. An electrical module according to claim 1, wherein each of the electrical components is one of the following: an antiparallel pair of a diode and a thyristor, an antiparallel pair of a diode and a gate turn-off thyristor (GTO), an antiparallel pair of a diode and a field effect transistor (FET), an antiparallel pair of a diode and a bipolar transistor, and an antiparallel pair of a diode and an insulated gate bipolar transistor (IGBT).

4. An electrical module according to claim 1, wherein the flexible material of the holder element contains at least one of the following: silicone, epoxy, and plastic.

5. An electrical module according to claim 1, wherein the flexible material of the holder element contains hot melt adhesive.

6. An electrical module according to claim 1, wherein the holder element is made of electrically insulating material.

7. An electrical module according to claim 1, wherein the holder element comprises electrically insulating material between a body of the holder element and the first contact surfaces of the electrical components.

8. An electrical module according to claim 1, wherein the electrical module comprises a control terminal common to the electrical components, and electrical conductors from the control terminal to the electrical components are inside the holder element.

9. An electrical module according to claim 1, wherein the electrical module comprises a control terminal common to the electrical components, and electrical conductors from the control terminal to the electrical components are on a surface of the holder element.

10. An electrical module according to claim 1, wherein the electrical module comprises a separate control terminal for at least one of the electrical components, each separate control terminal being electrically connected to at least one of the electrical components.

11. An electrical module according to claim 1, wherein the holder element comprises a hole that is adapted to receive a projection from one of the electrical conductors that is external to the electrical module.

12. An electrical module according to claim 1, wherein the electrical module comprises an electrical conductor arranged to electrically connect an electrical terminal of one electrical component of the electrical module to an electrical terminal of another electrical component of the electrical module.

13. An electrical converter device comprising first and second electrical conductors, and at least one electrical module that comprises:

two or more electrical components, each of the electrical components having a first contact surface capable of forming a galvanic contact with the first electrical conductor, and a holder element including flexible material with via holes arranged to support the electrical components with respect to each other in such a way that the first contact surfaces of the electrical components are capable of aligning with external surfaces independently of each other, wherein each of the electrical components has a second contact surface on an opposite side of that electrical component with respect to the first contact surface of that electrical component, the second contact surface being capable of forming a galvanic contact with the second electrical conductor.

14. A method for assembling an electrical converter device, the method comprising installing, as an element of the electrical converter device, at least one electrical module that comprises:

two or more electrical components, each of the electrical components having a first contact surface capable of forming a galvanic contact with an electrical conductor of the electrical converter device and a second contact surface on an opposite side of that electrical component with respect to the first contact surface of that electrical component, the second contact surface being capable of forming a galvanic contact with another electrical conductor of the electrical converter device, and a holder element, wherein the holder element includes material that is, at least during the installation of the electrical module, flexible and that has via holes arranged to support the electrical components of the electrical module with respect to each other in such a way that the first contact surfaces of the electrical components are capable of aligning with external surfaces independently of each other.

* * * * *